(12) United States Patent
Govyadinov et al.

(10) Patent No.: US 10,495,507 B2
(45) Date of Patent: Dec. 3, 2019

(54) DROP EJECTION BASED FLOW SENSOR CALIBRATION

(71) Applicant: HEWLETT-PACKARD DEVELOPMENT COMPANY, L.P., Fort Collins, CO (US)

(72) Inventors: Alexander Govyadinov, Corvallis, OR (US); Erik D Torniainen, Corvallis, OR (US); Pavel Kornilovich, Corvallis, OR (US); David P Markel, Corvallis, OR (US)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 147 days.

(21) Appl. No.: 15/546,780

(22) PCT Filed: Apr. 30, 2015

(86) PCT No.: PCT/US2015/028603
§ 371 (c)(1),
(2) Date: Jul. 27, 2017

(87) PCT Pub. No.: WO2016/175848
PCT Pub. Date: Nov. 3, 2016

(65) Prior Publication Data
US 2018/0023995 A1    Jan. 25, 2018

(51) Int. Cl.
*G01F 25/00* (2006.01)
*B41J 2/08* (2006.01)
*B41J 2/11* (2006.01)
*B41J 2/125* (2006.01)
*B81B 1/00* (2006.01)
(Continued)

(52) U.S. Cl.
CPC ........ *G01F 25/0007* (2013.01); *B05B 12/004* (2013.01); *B05B 17/04* (2013.01);
(Continued)

(58) Field of Classification Search
CPC ....... B05B 12/00; B05B 12/004; B05B 17/04; B41J 2/0456; B41J 2/04563; B41J 2/0458;
(Continued)

(56) References Cited

U.S. PATENT DOCUMENTS 4,380,770 A * 4/1983 Maruyama ........... B41J 2/16508
347/29
6,074,046 A * 6/2000 Wen ..................... B41J 2/04581
347/68

(Continued)

FOREIGN PATENT DOCUMENTS

CN    1460593    12/2003
CN    1709698    12/2005
(Continued)

OTHER PUBLICATIONS

Kuo et al.; Micromachined Thermal Flow Sensors—A Review; Micromachines; Jul. 23, 2012; pp. 1-24.

*Primary Examiner* — Francis C Gray
(74) *Attorney, Agent, or Firm* — HP Inc. Patent Department

(57) ABSTRACT

A droplet of fluid having a predetermined drop weight is ejected from a microfluidic channel. Electrical signals are received from a sensor in the microfluidic channel, wherein the electrical signals vary in response to the ejection of the droplet of fluid. The electrical signals of the sensor are calibrated to a rate of flow of fluid through the microfluidic channel based on a number of droplets ejected and the predetermined drop weight of each droplet.

20 Claims, 6 Drawing Sheets

(51) Int. Cl.

| | | |
|---|---|---|
| *G01F 1/68* | (2006.01) | |
| *B05B 17/04* | (2006.01) | |
| *B05B 12/00* | (2018.01) | |
| *B41J 2/05* | (2006.01) | |
| *G01F 1/696* | (2006.01) | |
| *B41J 2/045* | (2006.01) | |
| *B41J 2/14* | (2006.01) | |

(52) U.S. Cl.
CPC ........... *B41J 2/0456* (2013.01); *B41J 2/0458* (2013.01); *B41J 2/04563* (2013.01); *B41J 2/04581* (2013.01); *B41J 2/05* (2013.01); *B41J 2/08* (2013.01); *B41J 2/11* (2013.01); *B41J 2/125* (2013.01); *B41J 2/14153* (2013.01); *B41J 2/14201* (2013.01); *B81B 1/00* (2013.01); *G01F 1/68* (2013.01); *G01F 1/696* (2013.01); *G01F 25/00* (2013.01); *G01F 25/0023* (2013.01); *B05B 12/00* (2013.01)

(58) Field of Classification Search
CPC ... B41J 2/04581; B41J 2/05; B41J 2/08; B41J 2/11; B41J 2/125; B41J 2/14153; B41J 2/14201; G01F 1/68; G01F 1/696; G01F 25/00; G01F 25/0007; G01F 25/0023
See application file for complete search history.

(56) References Cited

U.S. PATENT DOCUMENTS

| | | | | |
|---|---|---|---|---|
| 6,357,293 | B1* | 3/2002 | Ando | G01F 1/698 73/204.17 |
| 6,568,799 | B1* | 5/2003 | Yang | B41J 2/14 347/85 |
| 7,877,220 | B2 | 1/2011 | Wray | |
| 2005/0092606 | A1* | 5/2005 | Reich | G01N 33/48707 204/450 |
| 2005/0219281 | A1 | 10/2005 | Seino et al. | |
| 2005/0257595 | A1* | 11/2005 | Lewis | G01F 25/0007 73/1.16 |
| 2008/0022765 | A1 | 1/2008 | Witt et al. | |
| 2009/0085946 | A1 | 4/2009 | Aoki et al. | |
| 2010/0063765 | A1* | 3/2010 | Carlisle | A61M 5/1483 702/100 |
| 2011/0122179 | A1 | 5/2011 | Hoisington et al. | |
| 2011/0312622 | A1* | 12/2011 | Azimi | B01L 3/5027 506/39 |
| 2013/0041234 | A1 | 2/2013 | Grinstein et al. | |
| 2013/0083131 | A1* | 4/2013 | Chung | B41J 2/1412 347/62 |
| 2013/0278657 | A1 | 10/2013 | Martin et al. | |
| 2014/0116128 | A1* | 5/2014 | Mantinband | G01F 1/6847 73/204.11 |
| 2014/0150520 | A1* | 6/2014 | Khan | E21B 47/10 73/1.35 |
| 2017/0159847 | A1* | 6/2017 | Alexeenko | F16K 99/0017 |

FOREIGN PATENT DOCUMENTS

| | | |
|---|---|---|
| CN | 101712232 | 5/2010 |
| CN | 102407661 | 4/2012 |
| CN | 204007804 U | 12/2014 |
| WO | WO 2004/070488 | 8/2004 |
| WO | WO 2014/076419 | 5/2014 |
| WO | WO-2014076419 | 5/2014 |

* cited by examiner

DROP EJECTION BASED FLOW SENSOR CALIBRATION

BACKGROUND

Flow sensors are used to monitor the flow of fluid. Calibration of such flow sensors often needs independent calibration at the time of manufacture. Real time calibration of flow sensors in microfluidic devices is difficult.

DETAILED DESCRIPTION OF EXAMPLES

Figure 1:
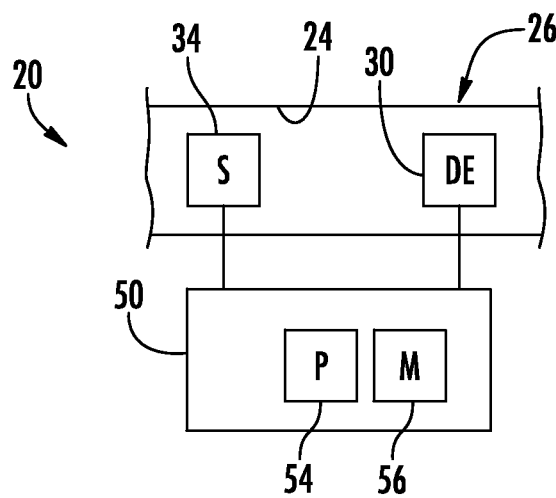
FIG. 1 is a schematic diagram of an example microfluidic sensor calibration system.

FIG. 1 schematically illustrates an example microfluidic sensor calibration system 20. As will be described hereafter, microfluidic sensor calibration system 20 calibrates a microfluidic sensor located in a microfluidic channel using a drop ejector that is integrated in the same microfluidic channel. As a result, the microfluidic sensor may be calibrated without separate componentry and in real time.

Microfluidic sensor calibration system 20 comprises a microfluidic channel 24 formed within or upon a microfluidic chip or substrate 26, drop ejector 30, sensor 34 and calibration electronics 50. Microfluidic channel 24 comprise a passage formed within a substrate 26. Microfluidic channel 24 has a width and height, each of which is in the sub-millimeter scale. In one implementation, microfluidic channel 24 has a width and height, each of which is between 5 and 200 μm and nominally between 5 and 50 μm. Although illustrated as being linear, microfluidic channel 24 may have a curved, serpentine, branched or other shape.

Drop ejector 30 comprises a device integrated into microfluidic channel 24 that, upon being selectively actuated, ejects, through a nozzle or other ejection port, a droplet of liquid or fluid having a predetermined drop weight or a predetermined volume. For purposes of this disclosure, the term "integrated" with respect to a chip, substrate or microfluidic channel means that a device or component is integral with the chip or substrate or that the device or component is built into or as part of the chip or substrate in that one or more structures of the device or component are formed or fabricated upon the chip or substrate such that they cannot be readily separated without cutting or severing portions of the chip or substrate.

Drop ejector 30 comprises a thermal inkjet resistor and associated ejection port or nozzle, wherein actuation of the thermal inkjet resistor generates sufficient heat to vaporize adjacent liquid or fluid to create a vapor bubble that expels a droplet of liquid, having a predetermined volume or drop weight, through the port or nozzle. In another implementation, drop ejector 30 comprises a piezo-resistive drop ejector, wherein actuation of a piezo resistive member moves a membrane or diaphragm to expel a droplet of liquid, having a predetermined volume or drop weight, through the port or nozzle. In yet other implementations, drop ejector 30 comprises other existing or future developed drop ejectors which are integrated as part of substrate 26 and which eject a predetermined quantity, volume or drop weight of liquid. The expulsion of the droplet of liquid out of the microfluidic channel 24 creates a low-pressure region or void within the microfluidic channel which results in adjacent fluid being drawn to occupy the low-pressure region or void.

Sensor 34 comprises a component device integrated into substrate 26 within, adjacent or along the microfluidic channel 24 to output electrical signals that vary in response to fluid flow within the microfluidic channel 24. For example, a first flow rate of liquid relative to sensor 34 may result in electrical signals having a first amplitude while a second different flow rate of liquid relative sensor 34 may result in the output of electrical signals having a second amplitude different than the first amplitude. The expulsion of a droplet of liquid by drop ejector 30 creates fluid flow within microfluidic channel 24 relative to sensor 34.

Calibration electronics 50 comprises a device that receives signals from sensor 34 and utilizes such signals (either in a raw format or after such signals have been filtered, converted or processed by electronics 50) to calibrate such electrical signals from sensor 34 to flow rate based upon drop ejection by drop ejector 30. For a given number of droplets of liquid ejected by drop ejector 30, electronics 50 determines the quantity of liquid ejected by drop ejector 30 using the predetermined and stored value for the quantity, volume or drop weight of an individual droplet of liquid ejected by drop ejector 30 (or the predetermined stored value for the quantity, volume or drop weight of multiple droplets of liquid injected by drop ejector 30). Using the determined quantity of liquid that was ejected and predetermined or stored values for the geometry of microfluidic channel 24, electronics 50 determines the flow rate of liquid or fluid within microfluidic channel 24. The flow of liquid across or relative to sensor 34 resulted in the output of electrical signals by sensor 34. Electronics 50 correlates, links or assigns the predetermined value for the flow rate of liquid to the particular electrical signals received from sensor 34 that were output by sensor 34 as a result of the flow of fluid caused by the ejection of the noted number of droplets by drop ejector 30. In this manner, electronics 50 assigns different flow rate values to different electrical signals received from sensor 34 so as to calibrate sensor 34.

In one implementation, electronics 50 converts the received electrical signals by an analog to digital converter, wherein electronics 50 comprises a processing unit that receives and utilizes digital signals. In another implementation, electronics 50 utilizes analog signals. In some implementations, electronics 50 applies a filter or various filters to modify signal characteristics, such as to reduce signal noise.

In the example illustrated, electronics 50 comprises processor 54 and memory 56. Processor 54 comprises a processing unit or multiple processing units that follow instructions provided in memory 56 to calibrate sensor 34. For purposes of this application, the term "processing unit" shall mean a presently developed or future developed processing unit comprising hardware that executes sequences of instructions contained in a non-transitory computer-readable medium or memory, such as memory 56. Execution of the sequences of instructions causes the processing unit to perform steps such as generating control signals. The instructions may be loaded in a random access memory (RAM) for execution by the processing unit from a read only memory (ROM), a mass storage device, or some other persistent storage. In other implementations, hard wired circuitry may be used in place of or in combination with software instructions to implement the functions described. For example, electronics 50 may be employed as part of one or more application-specific integrated circuits (ASICs). Unless otherwise specifically noted, the controller is not limited to any specific combination of hardware circuitry and software, nor to any particular source for the instructions executed by the processing unit.

In one implementation, electronics 50 calibrates sensor 34 using the flow rate determined based upon the geometry of microfluidic channel 24 and the predetermined or stored volume or quantity of liquid ejected by drop ejector 30 to create and store (in memory 56 or another memory) a lookup table that correlates different electrical signals from sensor 34 to different fluid flow rates. In another implementation, electronic 50 calibrates sensor 34 using the flow rate determined based upon the geometry of microfluidic channel 24 and the predetermined or stored volume or quantity of liquid ejected by drop ejector 30 to create and store (in memory 56 or another memory) a calibration curve associating different electrical signals received from sensor 34 to different flow rates. In one implementation, calibration curve is defined by at least one formula or algebraic expression converting receive electrical signals to flow rate estimates. The stored lookup table, calibration curve or formula facilitates subsequent determination of flow rates through microfluidic channel 24 based upon signals from sensor 34, wherein, but for the signals from sensor 34, the flow rate is unknown are not determinable, i.e., in circumstances where drop ejector 30 has not been employed to eject a predetermined quantity of liquid or fluid. In some circumstances, the stored lookup table or calibration curve facilitates subsequent determination of a flow rate through microfluidic channel 24, or another but similar microfluidic channel, based upon signals from a sensor other than sensor 34 that is substantially similar to sensor 34.

In one implementation, electronics 50 is entirely contained or integrated upon substrate 26 or the circuit chip containing microfluidic channel 24. For example, in one implementation, electronics 50 are integrated as part of the chip or substrate 26 in which microfluidic channel 24 is provided. In yet other implementations, portions of system 20 are distributed among separate substrates or devices. For example, in one implementation, electronics 50 are provided by a separate device that is electrically connected to sensor 34 and drop ejector 30 upon substrate 26.

Figure 2:
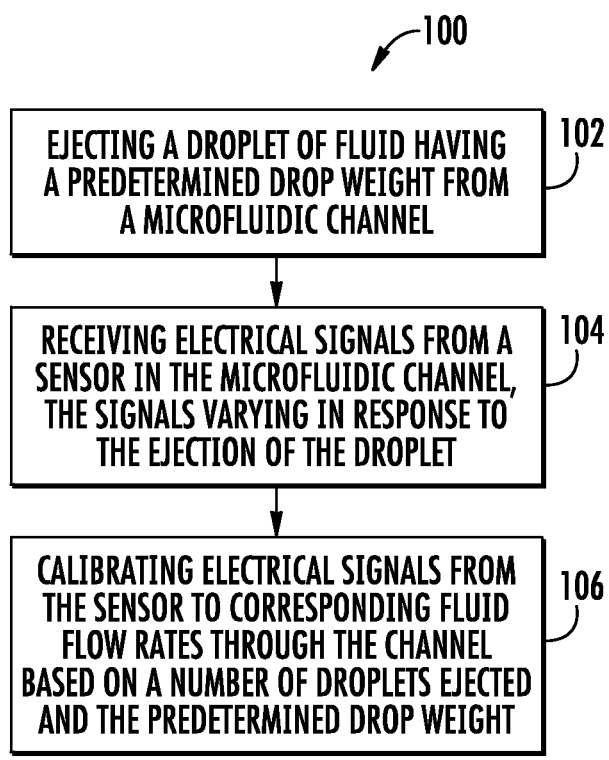
FIG. 2 is a flow diagram of an example method for calibrating a flow sensor based upon fluid droplet ejection.

FIG. 2 is a flow diagram of an example method 100 for calibrating flow sensor 34. In one implementation, method 100 is carried out by system 20 described above. As indicated by block 102, drop ejector 30 ejects a droplet of fluid having a predetermined drop weight from a microfluidic channel, such as microfluidic channel 24. In one implementation, the actuation of drop ejector 30 is in response to control signals output by electronics 50. In another implementation, the actuation of drop ejector 30 is in response to control signals from separate or independent electronics.

As indicated by block 104, electronics 50 receives electrical signals from sensor 34 in microfluidic channel 24. The signals vary in response to or based upon the flow of fluid relative to sensor 34 as a result of the ejection of the droplet in block 102. In one implementation, in block 102, multiple individual droplets of fluid or liquid are ejected, wherein the electrical signals are based upon the flow of fluid caused by the multiple droplets that were rejected.

As indicated by block 106, sensor 34 is calibrated by calibrating the electrical signals from sensor 34 to corresponding fluid flow rates through the channel which is determined based upon the number of droplets ejected and the predetermined drop weight of each individual droplet or the group of droplets. In some implementations, the geometries of microfluidic channel 24 and/or other factors are further used to calibrate sensor 34.

Figure 3:
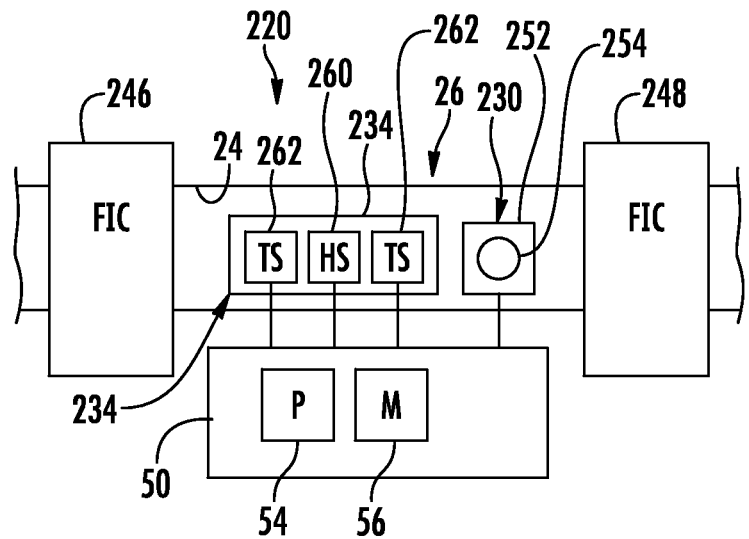
FIG. 3 is a schematic diagram of another example microfluidic sensor calibration system.

FIG. 3 schematically illustrates microfluidic sensor calibration system 220, another example implementation of microfluidic sensor calibration system 20. Microfluidic sensor calibration system 220 is similar to microfluidic sensor calibration system 20 except that system 220 is specifically illustrated as comprising drop ejector 230 and sensor 234 in lieu of drop ejector 30 and sensor 34, respectively. System 220 is further illustrated as specifically comprising fluid interaction components 246, 248. Those remaining components are elements of system 220 which correspond to components are elements of system 20 are numbered similarly.

Drop ejector 230 comprises a thermal inkjet resistor 252 and associated ejection port or nozzle 254, wherein actuation of the thermal inkjet resistor generates sufficient heat to vaporize adjacent liquid or fluid to create a vapor bubble that expels a droplet of liquid, having a predetermined volume or drop weight, through the port or nozzle 254. In another implementation, drop ejector 230 comprises a piezo-resistive drop ejector, wherein actuation of a piezo resistive member moves a membrane or diaphragm to expel a droplet of liquid, having a predetermined volume or drop weight, through the port or nozzle. In yet other implementations, drop ejector 230 comprises other existing or future developed drop ejectors which are integrated as part of substrate 26 and which eject a predetermined quantity, volume or drop weight of liquid. The expulsion of the droplet of liquid out of the microfluidic channel 24 creates a low-pressure region or void within the microfluidic channel which results in adjacent fluid being drawn to fill low-pressure region or void.

Sensor 234 comprises a flow sensor comprising a heat source 260 that is located so as to serve as a source of heat to fluid flowing within microfluidic channel 24 and a temperature sensor 262 spaced from the heat source 260 so as to sense the temperature fluid within microfluidic channel 24. In such an implementation, heat produced by the heat source provides a local temperature rise in the fluid within microfluidic channel 24. The flow of the fluid within microfluidic channel 24 absorbs and carries the produced heat to the temperature sensor 262. In one implementation, the heat source comprises a resistor proximate to or within microfluidic channel 24, wherein the resistor outputs heat upon receiving electrical current.

The temperature sensor 262 senses the amount of heat carried by the fluid flow. The greater the rate at which fluid flows through microfluidic channel, the greater the rate at which heat will be drawn from the heat source, carried to the temperature sensor and sensed by the temperature sensor downstream from the heat source. In such an implementation, sensor 234 outputs electrical signals in response to and based upon the temperature being sensed by the temperature sensor. In particular, temperature sensor 262 outputs electrical signals that vary in response to fluid flow through the microfluidic channel 24. Calibration electronics 50 calibrates or associates the electrical signals output by temperature sensor(s) 262 upon actuation of drop ejector 230 to particular flow rates determined based upon the predetermined drop weight of a droplet of liquid ejected by drop ejector 230.

In the example illustrated, sensor 234 comprises a pair of temperature sensors, one temperature sensor 262 on each side of the heat source to facilitate the sensing of fluid flow direction as well as magnitude. Although illustrated as being directly within microfluidic channel 24, heat source 260 and temperature sensors 262 may also be located along a side of channel 24. In some implementations, one or both of heat source 260 and temperature sensors 262 are in direct contact with fluid flowing through channel 24. In other implementations, one or both of heat source 260 and temperature sensors 262 are out of direct contact with the fluid flowing through channel 24, separated from the fluid by one or more intermediate spacing layers, but sufficiently close so as to apply to or receive heat from the fluid within channel 24.

Fluid interaction components 246, 248, schematically illustrated, comprise components integrated upon or into substrate 26 that interact with fluid flowing through microfluidic channel 24. Examples of fluid interaction components 246, 248 integrated upon the chip or substrate 26 include, but are not limited to, a microfluidic branch channel stemming from microfluidic channel 24, and microfluidic pump, such as a thermal inkjet resistor fluid pump or a piezo-resistive fluid pump, a microfluidic valve, a microfluidic multi-mixer, and a drop ejector, such as a thermal inkjet resistor or piezo-resistive diaphragm opposite a nozzle. Although sensor 234 and drop ejector 230 are illustrated as being sandwiched between fluid interaction components 246, 248, in other implementations, fluid flow sensor 234 may upstream or downstream of a single or multiple fluid interaction components 246, 248. In some implementations, system 220 may comprise more than two fluid interaction components 246, 248.

In one implementation, upon calibration of fluid flow sensor 234, the output of fluid flow sensor 234, indicating a current fluid flow within microfluidic channel 24, is utilized by a controller 251 to control or vary the operation of one or more of fluid interaction components 246, 248. For example, in one implementation, the signals output by fluid flow sensor 234 indicating the flow of fluid within microfluidic channel 24 are utilized by a controller, provided by electronics 50 or other electronics, to control the timing of the operation of a pump which moves fluid through microfluidic channel 24. As a result, system 220 facilitates a closed-loop feedback system with respect to the pumping or movement of fluid through microfluidic channel 24 at a desired rate. In other implementations, controller 251 may utilize signals from electronics 34 indicating fluid flow rate to control microfluidic valves, drop ejectors, microfluidic mixers and the like.

Figure 4:
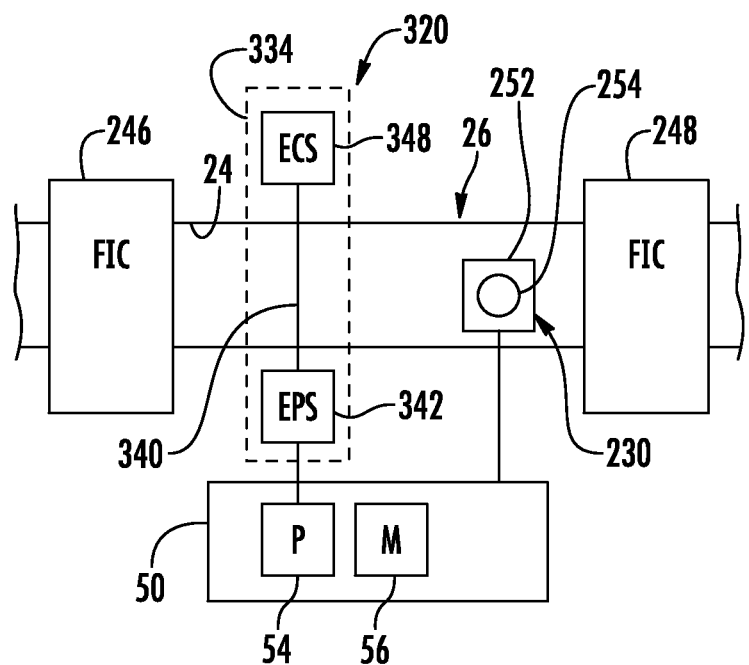
FIG. 4 is a schematic diagram of another example microfluidic sensor calibration system.

FIG. 4 schematically illustrates microfluidic sensor calibration system 320, another example implementation of microfluidic sensor calibration system 20. Microfluidic sensor calibration system 320 is similar to microfluidic sensor calibration system 220 except that system 320 is specifically illustrated as comprising sensor 334 in lieu of sensor 34. Those remaining components or elements of system 320 which correspond to components or elements of system 220 are numbered similarly.

Sensor 334 comprises heat emitting resistor 340 and electrical parameter sensor 342. Heat emitting resistor 340 has an electrical resistance that varies in response to temperature. Heat emitting resistor is proximate to or within microfluidic channel 24. The heat emitting resistor may comprise a structure formed a material or materials that have an electrical resistance such that heat is produced and emitted by the structure as electric current passes through the structure. The electrical resistance of heat emitting resistor 340 varies in response to temperature. The heat emitting resistor is to be connected to an electrical current source 348 which supplies electrical current to and circulates electrical current across heat emitting resistor. In one implementation, the electrical current source supplies a continuous direct-current (DC to heat emitting resistor 340. In another implementation, the electrical current source supplies time-spaced pulses of direct-current In another implementation, electrical current source 348 supplies an alternating current to heat emitting resistor. The use of alternating current or pulses of electrical current may reduce power consumption and sensor thermal impact while increasing sensitivity, noise resistance and a signal-to-noise ratio.

As liquid or fluid flows across heat emitting resistor 340 and as electrical current is passed through heat emitting resistor 340, the heat generated by heat emitting resistor 340 is carried away by the fluid flow. The greater the fluid flow, the greater the rate at which the heat will be carried away from heat emitting resistor 340. The rate at which heat is carried away may be further impacted by fluid properties such as density, heat conductivity and heat capacity. The greater the rate at which heat is carried away from heat emitting resistor 340, the lower the temperature of heat emitting resistor 340. This lower temperature will in turn impact the electric resistance of heat emitting resistor 340, further impacting the rate at which electrical current passes through heat emitting resistor 340. As a result, heat emitting resistor 340 provides a single structure that may be integrated into microfluidic channel 24, that produces heat and that exhibits a varying electrical resistance in response to the rate at which the produced heat is carried away by fluid flow.

In one implementation, heat emitting resistor 340 comprises an elongate line of heat emitting electrically resistive material or materials that extends completely across microfluidic channel 24. Heat emitting resistor 340 may have a high thermal coefficient of resistance (TCR), positive or negative, to deliver high response to temperature stimulus (1/Kelvin). In one implementation, heat emitting resistor 340 has a thermal coefficient of resistance (TCR), the relative change in resistance relative to temperature changes, of at least 1e-4 1/C. TCR for various materials for heat emitting resistor 330 are expressed by the formula $R=R(T\_0)=\exp[TCR(T-T\_0)]$, wherein TCR of Ta—Al is −100 ppm/C=−1e-4 1/C; TCR of WSiN is −450 ppm/C=−4.5e-4 1/C; and TCR of Al is 4e-3 1/C. In one implementation, heat emitting and heat sensing resistor 340 comprises, or is, platinum and has a thermal coefficient of resistance of at least 0.0035-0.0039 1/K. In other implementations, heat sensing resistor 330 made of WSiN cermet has thermal coefficient of resistance of −0.00045 1/K. A variety of other highly thermal sensitive material may be utilized for heat emitting and sensing element 340. Semi-conductor materials, due to their high negative TCR (−0.07 1/K for Si) may also serve as a thermal sensitive element.

In one implementation, heat emitting resistor 340 comprises a trace or wire extending across and in contact with a floor of microfluidic channel 24. In one implementation, heat emitting resistor 340 is directly fabricated or deposited upon the substrate forming the floor of the microfluidic channel 24. In one implementation, heat emitting resistor 340 has a length to width ratio of at least 5 to 1. In one implementation, heat emitting resistor 340 is formed from materials having a sheet resistance of between 10 and 1000 Ohm/square. In one implementation, heat emitting resistor 340 comprises at least one of aluminum, platinum, rhodium, copper, nickel, tantalum, tungsten, ruthenium, nickel chromium, copper nitride, silicon, polysilicon, germanium, carbon, graphing, tin oxide, zinc tin oxide, tantalum nitride, titanium nitride, magnesium oxide, rubidium oxide, vanadium oxide, and tungsten-silicon-nitride (WSixNy).

Electrical parameter sensor 342 comprises electrical componentry electrically connected or electrically coupled to heat emitting resistor 340 so as to sense an electrical parameter of heat emitting resistor 340 that is based on the resistance of the heat emitting resistor 340. In one implementation, the parameter may comprise a voltage across heat emitting resistor 340. In another implementation, the electrical parameter may comprise electrical current flow across heat emitting resistor 340. Examples of sensor 342 include, but are not limited to, a field effect transistor, a thermocouple, a bipolar junction transistor, other P-N junction sensing devices. Electrical parameter sensor 342 outputs electrical signals based upon the sensed electrical parameter. Such electrical signals are associated with or calibrated to different flow rates by electronics 50. Upon such calibration and generation of a lookup table or calibration curve, signals from sensor 334 are subsequently utilized to determine fluid flow rates within microfluidic channel 24 based upon signals from sensor 334, wherein, but for the signals from sensor 34, the flow rate is unknown are not determinable, i.e., in circumstances where drop ejector 340 has not been employed to eject a predetermined quantity of liquid or fluid. In some circumstances, the stored lookup table or calibration curve facilitates subsequent determination of a flow rate through microfluidic channel 24, or another but similar microfluidic channel, based upon signals from a sensor other than sensor 334 that is substantially similar to sensor 334.

Figure 5:
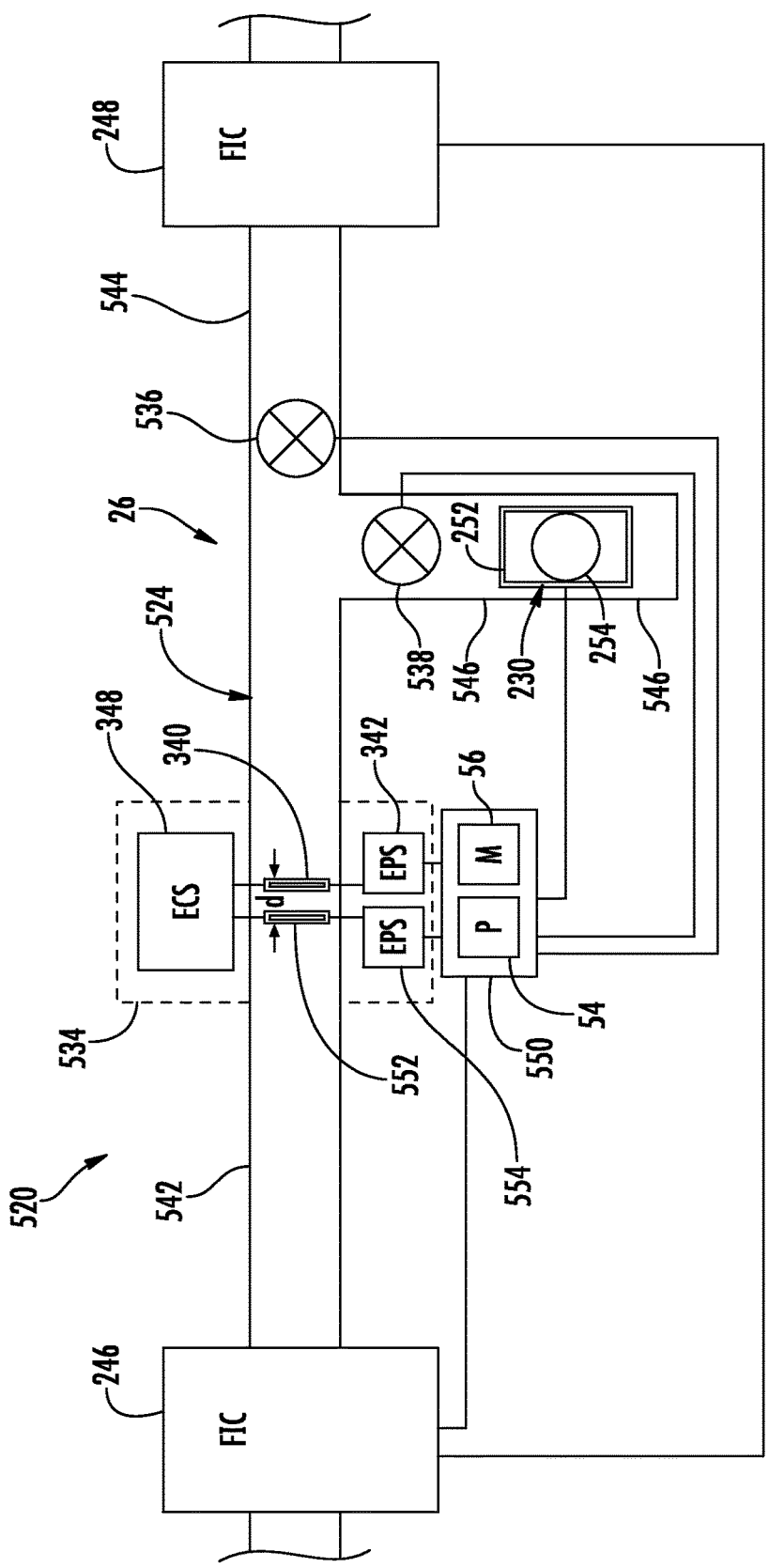
FIG. 5 is a schematic diagram of another example microfluidic sensor calibration system.

FIG. 5 schematically illustrates microfluidic sensor calibration system 320, another example implementation of microfluidic sensor calibration system 20. Microfluidic sensor calibration system 520 is similar to microfluidic sensor calibration system 320 except that system 520 comprises microfluidic channel 524, sensor 534 and calibration electronics 550 in place of channel 24, sensor 334 and calibration electronics 50, respectively. System 520 additionally comprises microfluidic valves 536 and 538. Those remaining components or elements of system 520 which correspond to components or elements of system 320 are numbered similarly.

Microfluidic channel 524 is similar to microfluidic channel 24 except that microfluidic channel 524 comprises a primary channel portion 542, a first branch portion 544 and a secondary branch portion 546. Primary channel portion 522 extends to fluid interaction components 246, 248 and contains sensor 534. Branch portions 544, 546 branch off of or stem from primary channel 542. Branch portion 544 continues on from primary channel portion 542 to fluid interaction component 248. In the example illustrated, secondary branch portion 546 comprises a blind channel or dead-end channel. Secondary branch portion 546 contains drop ejector 230. Although illustrated as perpendicularly extending from primary channel portion 542, in other implementations, branch portion 546 stems from portion 542 in other fashions. Although illustrated as having substantially the same width as portion 542, in other implementations, secondary branch portion 546 may have a different width as compared to portion 542.

Microfluidic flow sensor 534 is similar to sensor 334 except that system 520 additionally comprises a second heat emitting resistor 552 and a second parameter sensor 554. System 520 additionally comprises electronics 550 in lieu of electronics 50 which calibrates the flow measurement signals received from heat emitting resistor 340, 552 to different flow rates determined based upon the predetermined quantity, volume or drop weight of liquid ejected by drop ejector 230 during the calibration process.

Heat emitting resistor 552 is similar to heat emitting resistor 340. As with heat emitting resistor 340 emitting resistor 552 is integrated into substrate 26, extends across microfluidic channel 24 and is electrically connected or coupled to its associated electrical parameter sensor 554. Heat emitting resistor 552 is spaced from heat emitting resistor 340 in a direction along a longitudinal length of microfluidic channel 24. In one implementation, heat emitting resistor 552 is spaced from emitting resistor 340 based upon thermal crosstalk. In one implementation, heat emitting resistor 552 is spaced from heat emitting resistor 340 by a distance d of between a lower value of between 10 µm and 20 µm and an upper value of between 500 µm and 1000 µm and spaced by distanced nominally between 50 µm and 100 µm. As will be described hereafter, the additional emitting resistor 552 facilitates differential signals which indicate flow direction, in addition to flow magnitude.

In one implementation, heat emitting resistor 552 is thermally isolated or thermally insulated with respect to heat emitting resistor 340 such that heat transfer from one of resistors 340, 552 to the other of resistors 340, 552, other than through the carriage of heat by the flow of fluid, such as through or across the substrate 26 is reduced. In other words, solid-state heat conductance through substrate 26 is isolated from convection heat transfer through the flow of fluid. For example, in one implementation, portions of substrate 26 extending between and about resistors 340, 552 are formed from a material or a combination of materials having a lower degree of thermal conductivity as compared to the fluid circulating within channel 24. In one implementation, the portion of substrate 26 are formed from a material or combination materials having a lower degree of thermal connectivity as compared to the remaining materials of substrate 26. For example, in one implementation, portions of substrate 26 that otherwise would come into contact with resistors 340, 552 are covered, layered or coated with an oxide layer. As a result, heat transfer through substrate 26 from one of resistors 340, 552 to the other resistors 340, 552 is reduced to facilitate greater sensing accuracy. In one implementation, the material or materials extending between and about resistors 340 and 552 has a thermal diffusivity (thermal conductivity/heat capacitance ($cm^2/s$)) of less than or equal to 0.01 $cm^2/s$.

In another implementation, solid-state heat conductance through substrate 26 is isolated from convection heat transfer through the flow fluid by electrical current source 348 transmitting electric current across resistors 340, 552 in an alternating current pulsed manner mode. For example, in one implementation, the transmission of electric current across resistor 340, 552 is provided with time-space electrical pulses which are out of phase with respect to one another, whereby the sensing of the electrical parameter by sensors 342, 552 is also offset in time with respect to one another. In such implementations, the use of alternating current pulses further facilitates greater temperature differentials, producing greater resistance variations which allow the sensitivity of sensor 522 to be enhanced.

In one implementation, an electrical current pulse of 0.1 μs-10 ms is transmitted across resistors 340, 552 at a frequency of between 120 kHz and 10 Hz and nominally between 1 and 100 kHz. In one implementation, in which resistors 340, 552 are formed from WSiN, electrical current is supplied to each of the resistors at an amperage of between 0.1 mA and 50 mA and a frequency of between 48 kHz and 10 Hz. In one implementation, in which resistors 340, 552 comprise Ta—Al alloy, electrical current is supplied to each of the resistors at an amperage of between 0.1 and 500 mA and a frequency of between 12 kHz and 1 Hz. In one implementation, in which resistors 340, 552 are formed from platinum, electrical current is supplied to each of the resistors at an amperage of between 0.1 mA and 50 mA and a frequency of between 0 and 15 kHz.

Electrical parameter sensor 554 is similar to electrical parameter sensor 342. Electrical parameter sensor 554 comprises electrical componentry electrically connected or electrically coupled to heat emitting resistor 552 so as to sense electrical parameter of heat emitting resistor 552 that is based on the resistance of the heat emitting resistor 552. In one implementation, the parameter may comprise a voltage across heat emitting resistor 552. In another implementation, the electrical parameter may comprise electrical current flow across heat emitting resistor 552. Examples of each sensor 554 include, but are not limited to, a field effect transistor, a thermocouple, a bipolar junction transistor, and/or other P-N junction sensing devices. Each electrical parameter sensor 554 outputs electrical signals based upon the sensed electrical parameter. Such electrical signals are linked or associated with different fluid flow values by electronics 550 to calibrate sensor 534.

Microfluidic valves 536, 538 comprise microfluidic devices within microfluidic channel 524 that facilitate the selective opening and closing of selected portions of microfluidic channel 524. In the example illustrated, microfluidic valve 536 selectively opens and closes branch portion 544, directing fluid from primary channel portion 542 to branch portion 546. Valve 538 selectively opens and closes branch portion 546, directing fluid from primary channel portion 542 to branch portion 544. Valve 538 extends between drop objected to 30 and the junction of primary channel portion 542 and branch portion 546.

Electronics 550 are similar to electronics 50 described above. Electronics 550 receives signals from each of electrical parameter sensors 342, 554. Calibration electronics 550 comprises a device that calibrates such electrical signals from sensor 534 to flow rate based upon drop ejection by drop ejector 230. For a given number of droplets of liquid ejected by drop ejector 230, electronics 550 determines the quantity of liquid ejected by drop ejector 230 using the predetermined and stored value for the quantity, volume or drop weight of an individual droplet of liquid ejected by drop ejector 230 (or the predetermined stored value for the quantity, volume or drop weight of multiple droplets of liquid injected by drop ejector 230). Using the determined quantity of liquid that was ejected and predetermined or stored values for the geometry of microfluidic channel 524, electronics 550 determines the flow rate of liquid or fluid within microfluidic channel 524. The flow of liquid across or relative to heat emitting resistors 340, 552 results in the output of electrical signals by sensor 534. Electronics 550 correlates, links or assigns predetermined value for the flow rate of liquid to the particular electrical signals received from sensor 534 and that were output by sensor 534 as a result of the flow of fluid caused by the ejection of the noted number of droplets by drop ejector 230. In this manner, electronics 550 assigns different flow rate values to different electrical signals received from sensor 534 so as to calibrate sensor 534.

In one implementation, electronics 550 converts the received electrical signals by an analog to digital converter, wherein electronics 550 comprises a processing unit that receives and utilizes digital signals. In another implementation, electronics 550 utilizes analog signals. Some implementations, electronics 550 applies a filter or various filters to modify signal characteristics, such as, for example, reducing signal noise.

To calibrate sensor 534, processor 54, following instructions contained memory 56, outputs control signals closing valve 536 and opening valve 538. Processor 54, following instructions contained memory 56, further outputs control signals actuating drop ejector 230. As a result, a droplet or multiple droplets are ejected by drop ejector 230, creating a void or negative pressure region within branch portion 546. This void is filled by drawing liquid or fluid into branch portion 546, wherein the liquid being drawn flows across or relative to sensor 534, across heat emitting resistors 340, 542 in the illustrated example.

Prior to or during the flow of liquid across sensor 534, processor 54, following instructions contained memory 56, outputs control signals to actuate sensor 534. In the example illustrated, processor 54 outputs control signals causing an electrical current source to supply electrical current to one or both of these emitting resistors 340, 542. As a result, resistors 340, 542 output heat. As resistors 340, 542 heat up, they generate heat that is transmitted to surrounding fluid. As the liquid or fluid flows across or relative to resistors 340, 552, the generated heat is conducted to the liquid and carried away by the flow. The rate at which heat is drawn or carried away by the flow of liquid varies based upon the flow rate of the fluid. The rate at which heat is drawn or carried away by the flow of liquid further impacts the temperature of resistors 340, 542 and their electrical resistance. Electrical parameter sensors 342, 554 output electrical signals which vary depending upon the changing electrical resistance of resistors 340, 552. Processor 54, following instructions contained in memory 56, associates electrical signals received from electrical parameter sensors 342, 554 with a flow rate determined based upon the previously determined drop ejection rate, the number of droplets that were rejected and their respective drop weights that resulted in electrical signals being output by electrical parameter sensors 342, 554. Such associations are stored, such as in a lookup table or calibration curve.

During use of microfluidic channel 524 to transmit fluid to fluid interaction component 246 and/or fluid interaction component 248, processor 54, following instructions contained in memory 56, outputs control signals closing valve 538 and branch portion 546 and opening valve 536 and branch portion 544. As a result, fluid is permitted to flow through and between primary channel portion 542 and branch portion 544 under the influence of a pump or other device independent of drop ejector 230. As the liquid or fluid flows across or relative to resistors 340, 552, the generated heat is conducted to the liquid and carried away by the flow. The rate at which heat is drawn or carried away by the flow of liquid varies based upon the flow rate of the fluid. The rate at which heat is drawn or carried away by the flow of liquid further impacts the temperature of resistors 340, 542 and their electrical resistance. Electrical parameter sensors 342, 554 output electrical signals which vary depending upon the changing electrical resistance of resistors 340, 552. To determine or estimate the rate of fluid flow, processor 54 retrieves and consults the lookup table, calibration curve or the like and identifies the flow rate value that correlates to the signals received from sensor 534.

In one implementation, processor 54, following instructions contained memory 56, utilizes the determined or estimated fluid flow rate within channel 524 and across sensor 534 to control other devices such as fluid interaction component 246 or fluid interaction component 248. For example, in one implementation, if the identified fluid flow rate is insufficient for a particular process being carried out, processor 54 outputs control signals causing the pump (which may be one of fluid interaction component 246, 248), or additional pumps to increase the rate of fluid flow. In another implementation, based upon the identified fluid flow rate, processor 54 changes the rate at which fluid is mixed, changes the rate at which constituents, such as cells within the fluid, are sensed or extracted, and/or changes the rate at which materials or constituents are added to the liquid or fluid flowing through channel 524. Because system 520 utilizes drop ejector 230 which is integrated as part of substrate 26 to calibrate sensor 534, system 520 facilitates real-time frequent calibration or recalibration of sensor 534 without sensor 534 having to be connected and disconnected to a separate calibration device. System 520 facilitates repeated calibration of sensor 534 in the field by the end-user.

Figure 6:
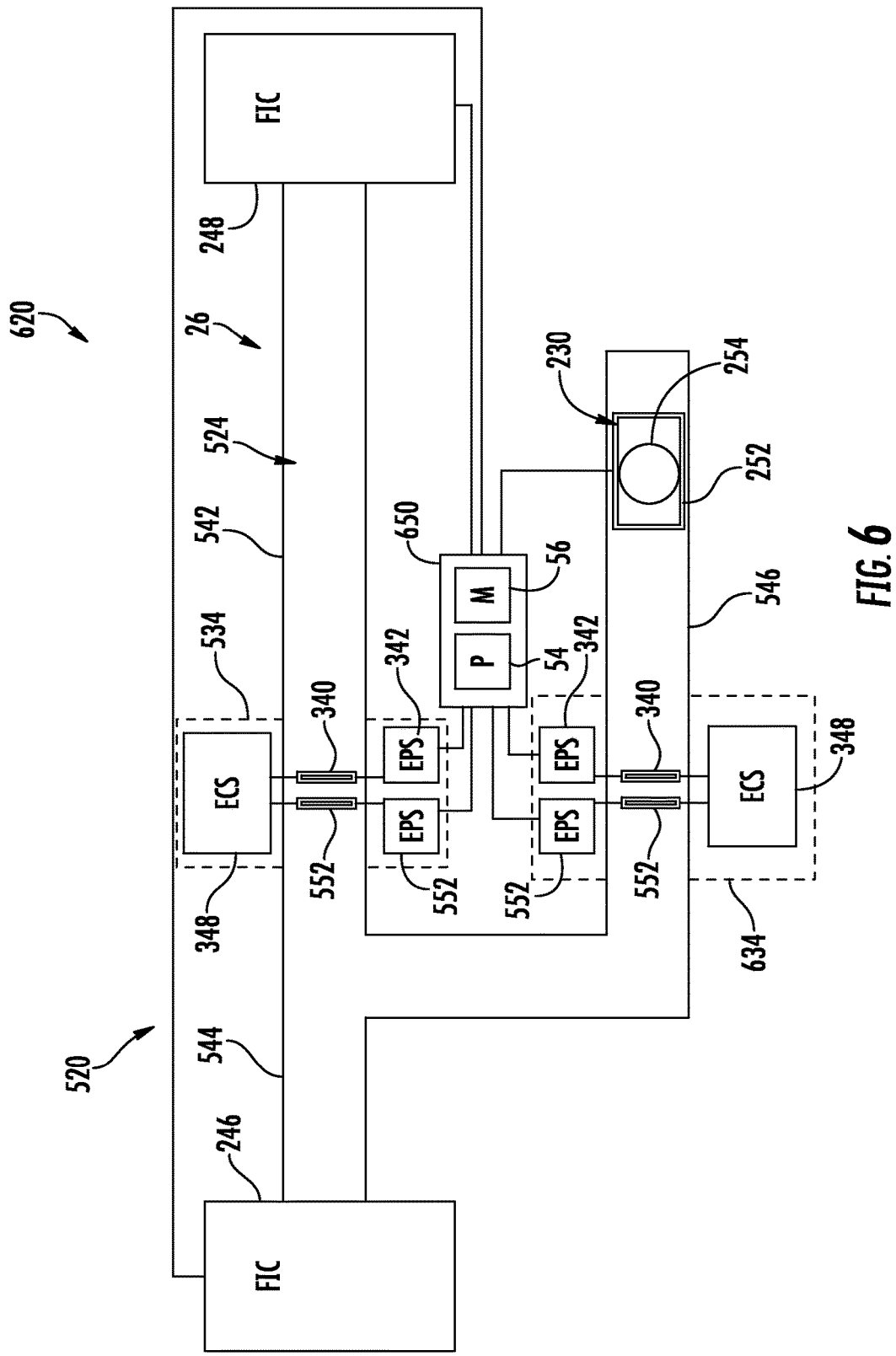
FIG. 6 is a schematic diagram of another example microfluidic sensor calibration system.

FIG. 6 schematically illustrates microfluidic sensor calibration system 620, another example implementation of microfluidic sensor calibration system 20. Microfluidic sensor calibration system 620 is similar to microfluidic sensor calibration system 520 except that system 520 omits valve 536, 538, additionally comprises flow sensor 634 and comprises calibration electronic 650 in place of calibration electronics 550. Those remaining elements or components of microfluidic sensor calibration system 620 which correspond to previously described elements or components are numbered similarly.

Microfluidic flow sensor 634 is similar to microfluidic flow sensor 534 except that microfluidic flow sensor 634 is located within branch portion 546, the same branch portion that contains drop ejector 230. Those components of microfluidic flow sensor 634 which correspond to components of microfluidic flow sensor 534 are numbered similarly.

Calibration electronics 650 is similar to calibration electronics 550 except that calibration electronics 650 uses calibration of microfluidic flow sensor 634 within branch portion 546, based upon drop ejection, to estimate or determine fluid flow rates based upon signals received from a different flow sensor, microfluidic flow sensor 534. Calibration electronics 650 calibrates, links or associates signals from sensor 634 to different flow rates determined based upon the predetermined quantity of liquid ejected by drop ejector 230 resulting in the output of such signals from sensor 634. The relationship or correlation between predetermined flow rates and signals received from sensor 634 is stored, such as in a calibration curve, formula, or lookup table, for subsequent use to estimate or determine fluid flow within primary channel portion 542 and/or branch portion 544 based upon signals received from sensor 534 during non-calibration operations or processes being carried out using the chip or substrate 26.

In one implementation, the determined and stored relationship between flow rates based upon drop ejection (the stored relationship) and the signals from sensor 634 is directly used in an unmodified fashion to subsequently determine or estimate flow rates based upon signals from sensor 534. In yet another implementation, processor 54, following instructions contained memory 56, applies various offsets or adjustments to the stored relationship between flow rates based upon drop ejection and the signals from sensor 634 when calculating our estimating fluid flow based upon signals received from sensor 534. For example, in one implementation, processor 54 of calibration electronics 650 applies offsets or adjustments to the stored relationship based upon or to accommodate predetermined differences, if any, between the functioning or characteristics of sensors 534 and 634. In one implementation, processor 54 of calibration electronic 650 applies offsets or adjustments additionally or alternatively based upon differences between the relative locations of sensors 534, 634 (such as differences in the locations of resistors 340, 552 within their respective channels). In one implementation, processor 54 of calibration electronic 650 applies offsets or adjustments to the stored relationship additionally or alternatively based upon differences in the shape or dimensions of the respective portions of microfluidic channel 524 containing the sensing elements (emitting resistors 340, 552 in the example illustrated) of the different sensors 534, 634.

During calibration, electronic 650 calibrates, links or associates the signals received from sensor 634 to flow rates determined based upon predetermined drop weights, quantities or volumes of liquid or fluid injected by drop ejector 230. The stored relationship is ultimately used by electronic 650 to later determine fluid flow rate based on signals from sensor 534. During such subsequent use, drop ejector 230 is not fired or actuated such that little or no fluid flow occurs through branch portion 546. Although not illustrated, in some implementations, one or more valves may be additionally employed to close branch portion 546 during such subsequent non-calibration processes carried out by the chip or substrate 26.

Figure 7:
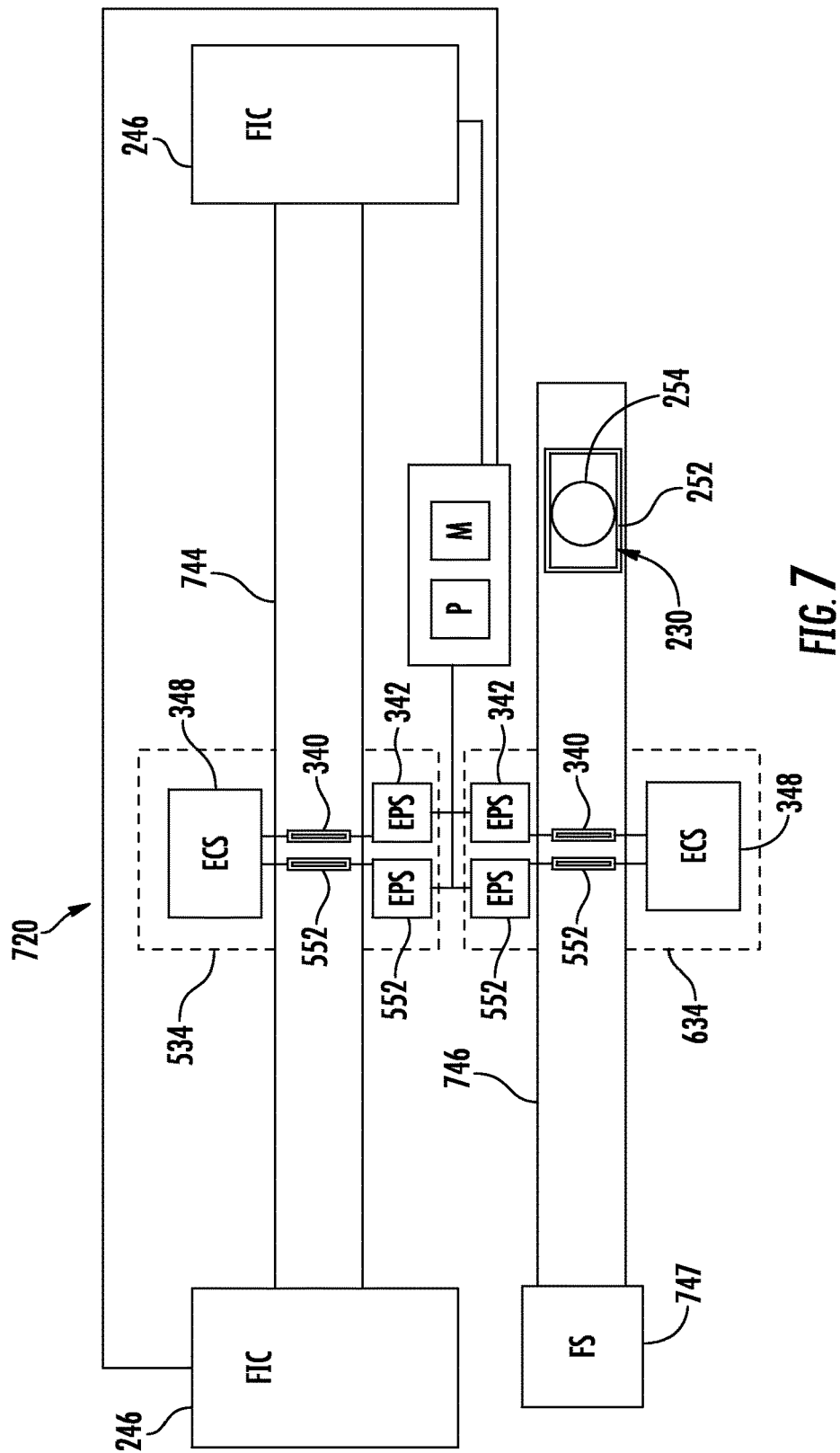
FIG. 7 is a schematic diagram of another example microfluidic sensor calibration system.

FIG. 7 schematically illustrates microfluidic sensor calibration system 720, another example implementation of microfluidic sensor calibration system 20. Microfluidic sensor calibration system 720 is similar to microfluidic sensor calibration system 620 except that system 720 comprises two independent or isolated microfluidic channels, primary microfluidic channel 744 and calibration microfluidic channel 746. Those remaining components or elements of system 720 which correspond to previously described components or elements are numbered similarly.

Unlike system 620, system 720 calibrates, links or associates signals from sensor 634 to predetermined flow rates based upon drop ejection by drop ejector 230, wherein the fluid from fluid input 747 is distinct from the fluid source or fluid input that supplies the fluid or liquid flows across sensor 534. The operation of electronics 650 is similar to that described above with respect to system 620. Although systems 620 and 720 are illustrated as sharing electronic 650 which does both (1) calibrating sensor 634 to drop ejection based flow quantities, (2) estimating flow rates for sensor 534 using the stored relationship and signals from sensor 534 and (3) controlling fluid interaction components 246, 248 based upon the determined flow rate from sensor 534, in other implementations, separate electronics, such as separate processors and/or memories are used to carry out the calibration of sensor 634, the flow rate estimation based upon signals from sensor 534 and/or the control of fluid interaction components based upon the flow rate estimation. In the examples illustrated in FIGS. 6 and 7, both of channels 744, 746 and their electronics 550, 650 (whether shared or not) are provided on a single chip or substrate 26.

In another implementation, channels 744, 746 and their associated electronics are provided on distinct chips or substrates.

Figure 8:
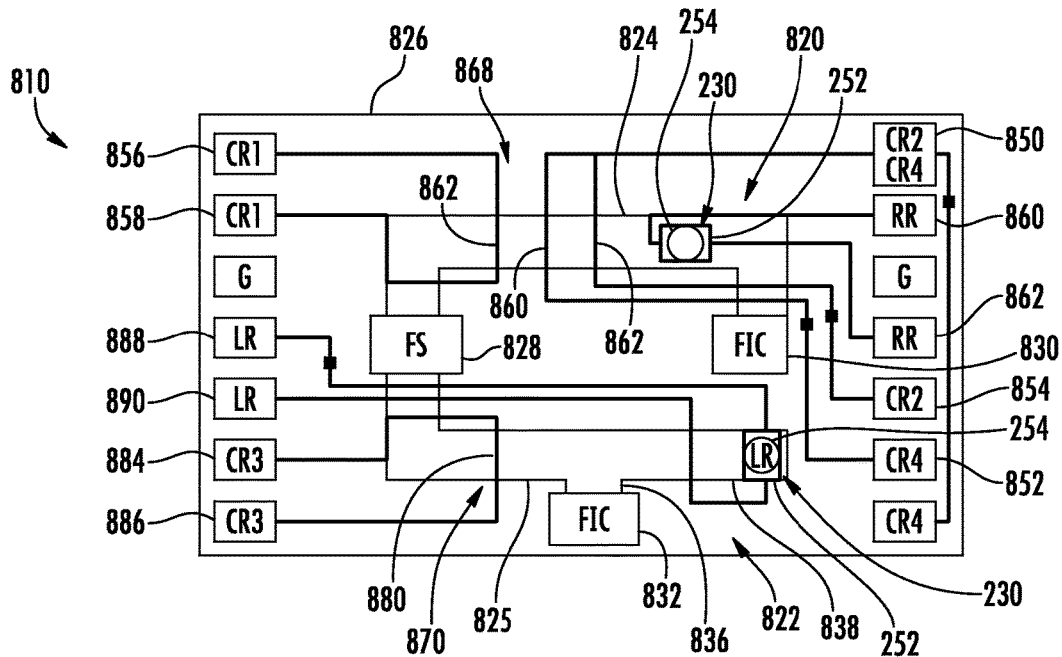
FIG. 8 is a schematic diagram of an example microfluidic chip to be used as part of a microfluidic sensor calibration system.

FIG. 8 schematically illustrates an example microfluidic chip 810 which is usable as part of a microfluidic sensor calibration system, such as the system described above. Chip 810 supports two microfluidic sensor calibration subsystems 820 and 822. In addition to microfluidic sensor calibration subsystems 820, 822, microfluidic chip 810 comprises microfluidic channels 824, 825 provided on substrate 826, fluid supply 828, fluid interaction components 830, 832 and various electrical contacts or contact pads for systems 820, 822. Substrate 826 comprises a dielectric material, such as silicon, upon which the components of chip 810 are formed.

Microfluidic channels 824, 825 are formed within or upon substrate 26. Microfluidic channel 824 extends from a fluid source 828 to fluid interaction component 830. Microfluidic channel 825 extends from fluid source 828 and comprises a branch portion 836 connected to fluid interaction component 832 and another branch portion 838 connected to a drop ejector of microfluidic sensor calibration system 822. Each of channels 824, 825 has a width and height, each of which is in the sub-millimeter scale. In one implementation, microfluidic channels 824, 825 each have a width and height, each of which is between 5 and 200 μm and nominally between 5 and 50 μm. Although illustrated as being substantially linear, microfluidic channels 824, 825 may have a curved, serpentine, branched or other shape.

Fluid interaction components 830, 832, schematically illustrated, comprise components integrated upon or into substrate 826 that interact with fluid flowing through microfluidic channels 824, 825. Examples of fluid interaction components 830, 832 integrated upon the substrate 26 include, but are not limited to, a microfluidic branch channel stemming from microfluidic channel 824, 825, a microfluidic pump, such as an inertial pump, a piezo-resistive fluid pump, a microfluidic valve, a microfluidic multi-mixer, and a drop ejector, such as a thermal inkjet resistor or piezo-resistive diaphragm opposite a nozzle.

Microfluidic sensor calibration subsystem 824 is similar to microfluidic sensor calibration system 220 described above except that subsystem 824 is adapted to be connected to an independent or separately provided electrical current source, electrical parameter sensors and independent or separate calibration electronics. Calibration subsystem 824 comprises heat source 860, temperature sensors 862 and drop ejector 230 (described above). Heat source 860 comprises a wire or trace extending across channel 824 and formed from a material such that the wire tray submits heat to heat surrounding fluid upon receiving electrical current from an electrical current source. In the example illustrated, heat source 860 is to be electrically connected to contact pads 850 and 852 which are to be electrically connected to a source of electrical current, such as electrical current source 348 described above.

Temperature sensors 862 comprise devices that sense or detect changes in the temperature of surrounding fluid. As with temperature sensors 262 described above, temperature sensors 862 are spaced from heat source 860 and facilitate detection of the magnitude of fluid flow as well as its direction. In the example illustrated, temperature sensors 862 comprise wires or traces extending across channel 824 and formed from a material that has an electrical resistance that varies in response to changes in temperature. Temperature sensors 862 do not emit heat to a substantial degree, but are cold resistors. Temperature sensors 862 are likely connected to contact pads 850, 854, 856 and 858 which are to be electrically connected to a source of electric current (positive and negative electrodes) of an electric current source such as electric current source 348 described above.

Temperature sensors 862 cooperate with heat source 860 to detect fluid flow rate through channel 824. Sensors 862 and heat source 864 form a flow sensor 868 similar to flow sensor 234 described above. The resistor of heat source 860 emit heat which is carried away and across one of resistors serving as temperature sensors 262. The rate at which heat is carried and conducted to the resistor forming temp sensor 262 impacts the surrounding temperature of the resistor which impacts the resistance of the resistor. The electric resistance across the resistor is sensed by electrical parameter sensors which are connected to the resistors, forming temperature sensors 862, by contact pads 850, 854, 856 and 858.

Drop ejector 230 is described above. Drop ejector 230 comprises thermal inkjet resistor 252 and nozzle 254. Thermal inkjet resistor 252 is electrically connected to contact pads 860 and 862 which are to be connected to a source of electrical current.

In operation, liquid or fluid from fluid source 828 flows into channel 824. To calibrate the fluid sensor 868, an externally located controller, comprising a processing unit and a memory, outputs control signals causing electric current to be transmitted across the thermal inkjet resistor 252 via contact pads 860 and 862. As a result, thermal inkjet resistor 252 is heated to a temperature so as to vaporize adjacent fluid to expel a droplet of fluid through nozzle 254. Upon collapse of the paper bubble, fluid fills the empty void and flows across the resistors of flow sensor 868. Prior to or during the actuation of drop ejector 230, the externally located processing unit outputs control signals causing electric current to be transmitted across resistors 860 and 862. The electrical current transmitted across the resistor of heat source 860 is sufficient to heat adjacent fluid. The electrical current transmitted across one or both of resistors of temperature sensor 862 is generally insufficient to produce substantial heat, but is sufficient to detect changes in the electrical resistance of the resistors of temperature sensor 862 brought about by changes in temperature. As a fluid flows across heat source 860, the fluid flow carries heat to the resistors of one of temperature sensors 862 (depending on directional flow), whereby electrical signals are produced which correspond to changes in the electrical resistance across the resistors of temperature sensors 862.

External calibration electronics, similar to calibration electronics 50 described above, receive the signals from the external electrical parameter sensors and calibrate, link or associate such signals to the fluid flow rate which produced such signals, the flow rate being based upon the predetermined number of droplets ejected by drop ejector 230 and the predetermined drop weight of a droplet or of a group of droplets. The relationship between such signals from flow sensor 868 and the predetermined ejected droplet-based flow rate is stored. This stored relationship is subsequently used by the external processor to estimate the rate of fluid flow across flow sensor 868 to fluid interaction component 830 based upon signals from sensor 868. Estimated flow rate is then used by the external processor to control the rate at which fluid is supplied or pumped to fluid interaction component 830.

Microfluidic sensor calibration subsystem 822 is similar to microfluidic sensor calibration system 320 described above except that subsystem 822 is adapted to be connected to an independent or separately provided electrical current source, electrical parameter sensors and independent or separate calibration electronics. Calibration subsystem 822 comprises heat emitting resistor 880 and drop ejector 230. Heat emitting resistor 880 serves as a flow sensor 870 and is similar to heat emitting resistor 340 described above except that heat emitting resistor 340 is electrically connected to electrical contact pads 884, 886 which are to be electrically connected to an external or separate electrical current source as well as an external or separate electrical parameter sensor. Drop ejector 230 is similar to drop ejector 230 described above with respect to system 320 except that drop ejector 230 is electrically connected to the electrical contact pads 888 and 890 which are to be electrically connected to an external or separate electrical current source.

To calibrate sensor 836, an external processor controller outputs control signals causing electric current to be supplied to thermal inkjet resistor 252, actuating drop ejector 230. As a result, a droplet or multiple droplets are ejected by drop ejector 230, creating a void or negative pressure region within channel 824. This void is filled by drawing liquid or fluid into channel 854 from fluid source 828, wherein the liquid being drawn flows across or relative to resistor 880.

Prior to or during the flow of liquid across resistor 880, external processor outputs control signals to actuate the flow sensor formed by heat emitting resistor 880. In the example illustrated, the external processor outputs control signals causing electrical current to be supplied to resistor 880. As a result, resistor 880 outputs heat. As resistor 880 heats up, the generated heat is transmitted to surrounding fluid. As the liquid or fluid flows across or relative to resistor 80, the generated heat is conducted to the liquid and carried away by the flow. The rate at which heat is drawn or carried away by the flow of liquid varies based upon the flow rate of the fluid. The rate at which heat is drawn or carried away by the flow of liquid further impacts the temperature of resistor 880 and its electrical resistance. External or separate electrical parameter sensors sense the changes in electrical resistance of resistor 880 brought about by temperature changes and output electrical signals which vary depending upon the changing electrical resistance of resistor 880. The external processor associates electrical signals received from the electrical parameter sensors with a flow rate determined based upon the previously determined drop ejection rate, the number of droplets that were ejected and their respective drop weights resulted in electrical signals being output by the electrical parameter sensors. Such associations are stored, such as in a lookup table or calibration curve. This stored relationship or association is subsequently used by the external processor to determine or estimate the rate of fluid flow across resistor 880 based upon signals from resistor 880. In one implementation, the determined rate a fluid flow is further used to provide closed loop feedback control of a pump or other fluid interaction components, such as fluid interaction component 832.

Because the components utilized to calibrate the flow sensors 868 and 870 are integrated into or upon substrate 826, calibration of such flow sensors 868 and 870 does not utilize external calibration components but for electrical parameter sensors and processors. As a result, flow sensors 868 and 870 may be more readily calibrated in real time at the point of use and in the field to accommodate changes in environment, in temperature and liquids or fluids. At the same time, because chip 810 utilizes external or separate electrical parameter sensors and calibration electronics, the cost and size of chip 810 is reduced. In some implementations, due it is low-cost, chip 810 is more readily disposable, such as after samples of blood or other bio-hazardous fluids have been analyzed or interacted upon.

Figure 9:
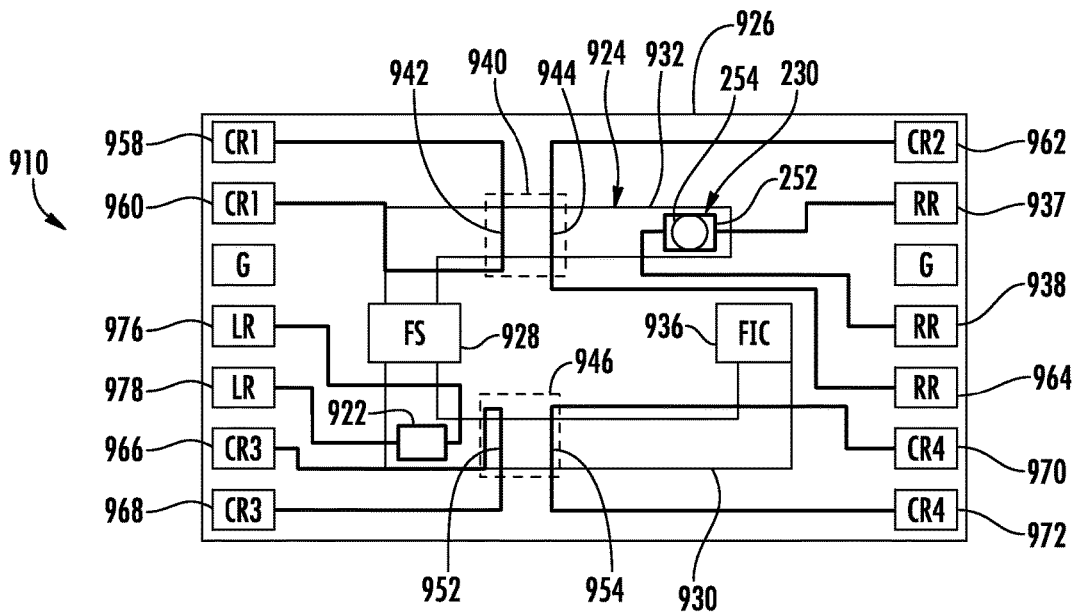
FIG. 9 is a schematic diagram of another example microfluidic chip to be use as part of a microfluidic sensor calibration system.

FIG. 9 schematically illustrates microfluidic chip 910. Microfluidic chip 910 is similar to system 620 described above with respect to FIG. 6 except that microfluidic chip 910 comprises various electrical contact pads, facilitating the use of external or separate electrical parameter sensors and calibration electronics, facilitating a smaller, less costly and potentially disposable microfluidic chip. Those components of microfluidic chip 910 which correspond to components that have been described above are numbered similarly.

As with the above-described implementations, microfluidic chip 910 utilizes a drop ejector 230 comprising a thermal inkjet resistor 252 and an associated nozzle 254 to eject droplets of liquid or fluid having a predetermined quantity, volume or drop weight, wherein the predetermined quantity, volume or drop weight corresponds to a defined flow rate value which is then linked to signals from a flow sensor to calibrate the flow sensor. In the example illustrated, thermal inkjet resistor 252 is electrically connected to electrical contact pads 937, 938 which are to be electrically connected to an external electric current source and external electronics that control actuation of drop ejector 230. FIG. 9 additionally illustrates microfluidic chip 910 as further comprising an inertial pump 922.

Microfluidic chip 910 comprises a microfluidic channel 924 formed within or upon substrate 926. Substrate 826 serves as a mechanical support for circuits. In one implementation, substrate 26 comprises a monocrystalline silicon, portions of which are selectively doped to form circuits or components of chip 910. Microfluidic channel 824 comprises a primary branch 930 and a calibration branch 932. Primary branch 930 extends from a fluid source 928 to fluid interaction component 936. Calibration branch 930 extends from fluid source 928 to a drop ejector. Each of branches 930, 932 has a width and height, each of which is in the sub-millimeter scale. In one implementation, each of branches 930, 932 has a width and height of between 10 and 200 μm and nominally a width and a height of between 10 and 50 μm. Although illustrated as being substantially linear, such branches 930, 932 may have a curved, serpentine, branched or other shape.

As shown by FIG. 9, microfluidic chip 910 comprises components for two distinct flow sensors, a first flow sensor 940 comprising heat emitting resistors 942, 944 and a second flow sensor 946 comprising heat emitting resistors 952 and 954. In the example illustrated, the pairs of heat emitting resistors for each of flow sensors 940, 946 are similar to one another. Each of heat emitting resistors 942, 944 and heat emitting resistors 952, 954 are integrated into substrate 26, extends across their respective channels. As further shown by FIG. 9, the single substrate 26 supports each of microfluidic channel 924, sensors 940, 946 and drop ejector 230. Each pair of heat emitting resistors are spaced from one another in a direction along a longitudinal length of microfluidic channel 924. In one implementation, heat emitting resistors 942 and 952 are spaced from their respective heat emitting resistors 944 and 946 by a distance of between 10 um and 1000 um and nominally 100 um.

In one implementation, heat emitting resistors 942, 952 are thermally isolated or thermally insulated with respect to heat emitting resistors 944, 946, respectively, such that heat transfer between the resistors of each pair, other than through the carriage of heat by the flow of fluid, such as through or across the substrate 926, is reduced. In other words, solid-state heat conductance through substrate 926 is isolated from convection heat transfer through the flow of fluid. In one implementation, portions of substrate 926 extending between and about resistors each pair resistors are formed from a material or a combination of materials having a lower degree of thermal conductivity as compared to the fluid to be moved through channel 924. For example, in one implementation, portions of substrate 26 that otherwise would come into contact with resistors are covered, layered or coated with an oxide layer. As a result, heat transfer through substrate 926 between the resistors of each pair is reduced to facilitate greater sensing accuracy.

In another implementation, solid-state heat conductance through substrate 26 is isolated from convection heat transfer through the flow fluid through the application of time spaced pulses of electric current, whether direct-current or alternating current. For example, in one implementation, the transmission of electric current across each pair of resistors is provided with time-spaced electrical pulses which are out of phase with respect to one another, whereby the sensing of the electrical parameter by electrical parameter sensors is also offset in time with respect to one another. In such implementations, the use of pulses further facilitates greater temperature differentials, producing greater resistance variations which allow the sensitivity of sensors 940, 946 to be enhanced.

In one implementation, an electrical current pulse of 0.1 µs-10 ms is transmitted across resistors 942, 944, 952, 954 at a frequency of between 120 kHz and 10 Hz and nominally between 1 and 100 kHz. In one implementation, in which resistors 942, 944, 952, 954 are formed from WSiN, electrical current is supplied to each of the resistors at an amperage of between 0.1 mA and 50 mA and a frequency of between 48 kHz and 10 Hz. In one implementation, in which resistors 942, 944, 952, 954 are formed from Ta—Al alloy, electrical current is supplied to each of the resistors at an amperage of between 0.1 and 500 mA and a frequency of between 12 kHz and 1 Hz. In one implementation, in which resistors 942, 944, 952, 954 are formed from platinum, electrical current is supplied to each of the resistors at an amperage of between 0.1 mA and 50 mA and a frequency of between 0 and 15 kHz.

Heat emitting resistors 942, 944 are disposed within branch channel 932 and exhibit different degrees of electrical resistance in response to different temperatures brought about by different fluid flow rates. Heat emitting resistors 942, 944 are electrically connected to two pairs of electrical contact pads, contact pads 958, 960 and contact pads 962 and 964, respectively, for electric connection to externally located or separate electric parameter sensors and calibration electronics. Changes in the resistance across each of heat emitting resistors 942, 944 is sensed by the external electric parameter sensors and used by the external calibration electronics to identify a relationship between the different levels of resistance (represented by signals output by the external electrical parameter sensors) and different flow rates determined using the predetermined volume, quantity or drop weight of fluid that was ejected to cause the changes in fluid flow, the changes in temperature and the changes in the electric resistance of each of resistors 942, 944.

Heat emitting resistors 952, 954 are disposed within microfluidic branch 930 and exhibit different degrees of electrical resistance in response to different temperatures brought about by different fluid flow rates. Heat emitting resistors 952, 954 are electrically connected to two pairs of electrical contact pads, contact pads 966, 968 and contact pads 970 and 972, respectively, for electric connection to externally located or separate electric parameter sensors and calibration electronics. Changes in the resistance across each of heat emitting resistors 952, 954 is sensed by the external electric parameter sensors and used by the external calibration electronics to determine or estimate flow rates using the predetermined relationship between the different levels of electric resistance (represented by signals from elliptical parameter sensor) and flow rates. Although each of flow sensors 940, 946 is illustrated as comprising a pair of emitting resistors to provide both magnitude and direction values, in other implementations, one or both of flow sensors 940, 946 may comprise a single heat emitting resistor.

In one implementation, the determined and stored relationship between flow rates based upon drop ejection (the stored relationship) and the signals from sensor 940 is directly used in an unmodified fashion to subsequently determine or estimate flow rates based upon signals from sensor 946. In yet another implementation, the external independent calibration electronics applies various offsets or adjustments to the stored relationship between flow rates based upon drop ejection and the signals from sensor 940 when calculating or estimating fluid flow based upon signals received from sensor 946. For example, in one implementation, the external calibration electronics applies offsets or adjustments to the stored relationship based upon or to accommodate predetermined differences, if any, between the functioning or characteristics of sensors 940 and 946. In one implementation, the external calibration electronics applies offsets or adjustments additionally or alternatively based upon differences between the relative locations of sensors 940, 946 (such as differences in the locations of resistors 942, 944 and 952, 954 within their respective channels). In one implementation, the external calibration electronics applies offsets or adjustments to the stored relationship additionally or alternatively based upon differences in the shape or dimensions of the respective portions of microfluidic channel 924 containing the sensing elements (emitting resistors 942, 944, 952, 954 in the example illustrated) of the different sensors 940, 946.

Inertial pump 922 is located within branch channel 930 and electrically connected to electrical contact pads 976, 978. Inertial pump 922 comprises a pumping device located along channel 930 proximate to reservoir or fluid supply 928 and distant to fluid interaction component 936. In other words, inertial pump 928 is spaced from reservoir fluids apply 928 by a distance less than one half of the length of the total fluid path between fluid source 928 and fluid interaction component 936. Inertial pump 922 utilizes inertia and momentum within a channel that is relatively narrow compared to the devices it connects to produce fluid flow. For purposes of this disclosure, the term "inertial pump" refers to a pumping device that initially drives fluid in both directions within a channel that is relatively narrow to the reservoirs it connects, but wherein the pumping device is asymmetrically positioned between the fluid supply and fluid interaction component such that the end result is fluid being driven in a direction towards the most distant of the two devices.

In one implementation, inertial pump 922 comprises a bubble jet pump. A bubble jet pump is a pump that produces an initially expanding bubble to move or drive adjacent fluid away from the bubble. One example of a bubble jet pump comprises a micro-heater, such as a thermal inkjet (TIJ) pump. A TIJ pump utilizes one or more electrical resistors through which electric current is passed. The heat produced by the one or more resistors as electric current passes through the one or more resistors vaporizes fluid that is proximate to the resistors to create a bubble. As this bubble is initially created and expands, the bubble initially drives adjacent fluid away from the bubble.

In one implementation, the stored relationship between signals from flow sensor 940 and flow rates determined based upon the ejection of predetermined quantities of fluid by drop rejected 230 is used to estimate flow rates corresponding to signals received from flow sensor 946 as a result of actuation of inertial pump 922. Such an implementation, the external calibration electronics also serves as control electronics, adjusting the operation of inertial pump 922 based upon the flow rate of fluid within branch channel 930 estimated based upon the stored relationship. As a result, microfluidic chip 910 provides the ability to calibrate flow sensor 946 in the field and in real time while also providing closed loop feedback control of inertial pump 922.

Although the present disclosure has been described with reference to example implementations, workers skilled in the art will recognize that changes may be made in form and detail without departing from the spirit and scope of the claimed subject matter. For example, although different example implementations may have been described as including one or more features providing one or more benefits, it is contemplated that the described features may be interchanged with one another or alternatively be combined with one another in the described example implementations or in other alternative implementations. Because the technology of the present disclosure is relatively complex, not all changes in the technology are foreseeable. The present disclosure described with reference to the example implementations and set forth in the following claims is manifestly intended to be as broad as possible. For example, unless specifically otherwise noted, the claims reciting a single particular element also encompasses a plurality of such particular elements.

What is claimed is:

1. An apparatus comprising:
   a microfluidic channel;
   a sensor along the microfluidic channel to output electrical signals that vary in response to fluid flow through the microfluidic channel;
   a drop ejector having a predetermined drop weight along the microfluidic channel; and
   calibration electronics to calibrate the electrical signals from the sensor to flow rate based upon drop ejection by the drop ejector.

2. The apparatus of claim 1, wherein the drop ejector comprises a thermal inkjet resistor and a corresponding nozzle.

3. The apparatus of claim 1, wherein the microfluidic channel comprises a primary channel and a branch channel stemming from the primary channel, wherein the sensor is in the primary channel and wherein the drop ejector is in the branch channel.

4. The apparatus of claim 3 further comprising a second sensor in the branch channel, the second sensor being identical to the sensor.

5. The apparatus of claim 4 further comprising a substrate supporting the microfluidic channel, the sensor and the drop ejector, where the apparatus further comprises a fluid interaction component supported by the substrate to interact with fluid directed through the primary channel.

6. The apparatus of claim 5, wherein the fluid interaction component is selected from a group of fluid interaction components consisting of: a second microfluidic branch channel stemming from the primary channel; a microfluidic pump; a microfluidic multi-mixer; a second drop ejector; a microheater, an impedance sensor and a cytometer.

7. The apparatus of claim 3 further comprising a fluidic valve to selectively open and close the primary channel to direct fluid towards the branch channel.

8. The apparatus of claim 7 further comprising a second fluidic valve to selectively open and close the branch channel with respect to the primary channel.

9. The apparatus of claim 1, wherein the sensor comprises:
   a heat emitting resistor having a resistance that varies in response to temperature; and
   a sensor to sense an electrical parameter of the heat emitting resistor that is based on the resistance of the heat emitting resistor.

10. The apparatus of claim 1, wherein the sensor comprises a thermal mass flow sensor comprising a heating element and a temperature sensor spaced from the heating element, the temperature sensor outputting electrical signals that vary in response to fluid flow through the microfluidic channel.

11. The apparatus of claim 1 comprising a single substrate supporting the microfluidic channel, the sensor and the drop ejector.

12. The apparatus of claim 1, wherein the microfluidic channel has a channel width of between 5 and 200 μm and a channel height of between 10 and 200 μm.

13. A method comprising:
   ejecting a droplet of fluid having a predetermined drop weight from a microfluidic channel;
   receiving electrical signals from a sensor in the microfluidic channel, the electrical signals varying in response to the ejection of the droplet of fluid; and
   calibrating electrical signals from the sensor to corresponding fluid flow rate through the microfluidic channel based upon a number of droplets ejected and the predetermined drop weight of each droplet.

14. The method of claim 13, wherein a substrate supports the microfluidic channel and a drop ejector used to carry out the ejection of the droplet of fluid and wherein the method further comprises directing fluid through the microfluidic channel to a fluid interaction component supported by the substrate.

15. An apparatus comprising a non-transitory computer-readable medium containing instructions to direct a processor to:
   output signals to a drop ejector to eject a droplet of fluid from a microfluidic channel, the droplet having a predetermined drop weight;
   receive electrical signals from a sensor along the microfluidic channel, the signals varying in response to ejection of the droplet; and
   calibrate the sensor based upon a determined relationship between the received electrical signals from the sensor and a volume of fluid ejected by the drop ejector.

16. The apparatus of claim 1, wherein the calibration electronics correlate different electrical signals from the sensor to different flow rates through the microfluidic channel.

17. The apparatus of claim 1 comprising a single substrate supporting the microfluidic channel, the sensor, the drop ejector and the calibration electronics.

18. The apparatus of claim 17 further comprising a fluid interaction component selected from a group of fluid interaction components consisting of: a microfluidic pump, a microfluidic multi-mixer, an impedance sensor and cytometer.

19. The apparatus of claim 1 further comprising a fluid interaction component selected from a group of fluid interaction components consisting of: a microfluidic pump, a microfluidic multi-mixer, an impedance sensor and cytometer.

20. The apparatus of claim 1, wherein the calibration electronics correlate different electrical signals from the sensor two different flow rates based upon the predetermined drop weight of the drop ejector and drop ejection by the drop ejector.

* * * * *